United States Patent [19]
Eguchi et al.

[11] Patent Number: 5,815,055
[45] Date of Patent: Sep. 29, 1998

[54] MATCHED FILTER WITH IMPROVED SYNCHRONOUS CHARACTERISTICS, AND RECEPTION DEVICE AND COMMUNICATION SYSTEM USING THE SAME

[75] Inventors: Tadashi Eguchi, Tokyo; Akira Torisawa, Machida; Koichi Egara, Tokyo; Akihiro Koyama, Yokohama; Takahiro Hachisu, Yokohama; Akane Yokota, Yokohama, all of Japan

[73] Assignee: Canon Kabushiki Kaisha, Tokyo, Japan

[21] Appl. No.: 681,331

[22] Filed: Jul. 23, 1996

[30] Foreign Application Priority Data

| Jul. 24, 1995 | [JP] | Japan | 7-187190 |
| Jul. 18, 1996 | [JP] | Japan | 8-189421 |

[51] Int. Cl.[6] ............... H03H 9/64; H04B 1/69
[52] U.S. Cl. ............. 333/193; 333/194; 333/195; 333/196; 310/313 B; 364/821; 375/343
[58] Field of Search ................. 333/193–196; 310/313 R, 313 B, 313 C, 313 D; 364/821; 375/200, 207, 208, 343

[56] References Cited

U.S. PATENT DOCUMENTS

| 3,654,574 | 4/1972 | Dias | 333/154 |
| 3,697,899 | 10/1972 | Dias | 333/153 |
| 3,825,860 | 7/1974 | Carr | 333/151 |
| 4,506,239 | 3/1985 | Cho et al. | 333/196 |
| 5,477,098 | 12/1995 | Eguchi et al. | 364/821 X |
| 5,539,687 | 7/1996 | Torisawa et al. | 364/821 |

FOREIGN PATENT DOCUMENTS

| 0 005 953 | 12/1979 | European Pat. Off. . | |
| 0153092 A2 | 8/1985 | European Pat. Off. | 333/193 |
| 0 577 089 A1 | 1/1994 | European Pat. Off. | 375/343 |
| 57-89321 | 6/1982 | Japan | 333/194 |
| 07 135473 | 5/1995 | Japan . | |

OTHER PUBLICATIONS

"SAW MSK Matched Filter and Its Application", *Electronics & Communications in Japan, Part II*, vol. 68, No. 12, Dec. 1985, pp. 52–62.

*Primary Examiner*—Robert J. Pascal
*Assistant Examiner*—Barbara Summons
*Attorney, Agent, or Firm*—Fitzpatrick, Cella, Harper & Scinto

[57] ABSTRACT

A matched filter has an input IDT and an output IDT, and also has a device for preventing propagating surface acoustic waves from diverging. By preventing the divergence of surface acoustic waves, signals obtained in units of electrode finger pairs of the output IDT are uniformed. Furthermore, this application also discloses the following arrangement. That is, an arrangement for converging surface acoustic waves is adopted, and the width of surface acoustic waves input to the output IDT is set to be larger than at least the crossing width of electrode fingers, nearest to the input IDT, of those of the output IDT, so that some surface acoustic waves propagate along non-crossing portions of the electrode fingers, on the input IDT side, of those of the output IDT. With this arrangement, the influence of the crossing portions of the electrode fingers, closer to the input IDT, on the surface acoustic waves input to the crossing portions of the electrode fingers, farther from the input IDT, can be relaxed.

54 Claims, 16 Drawing Sheets

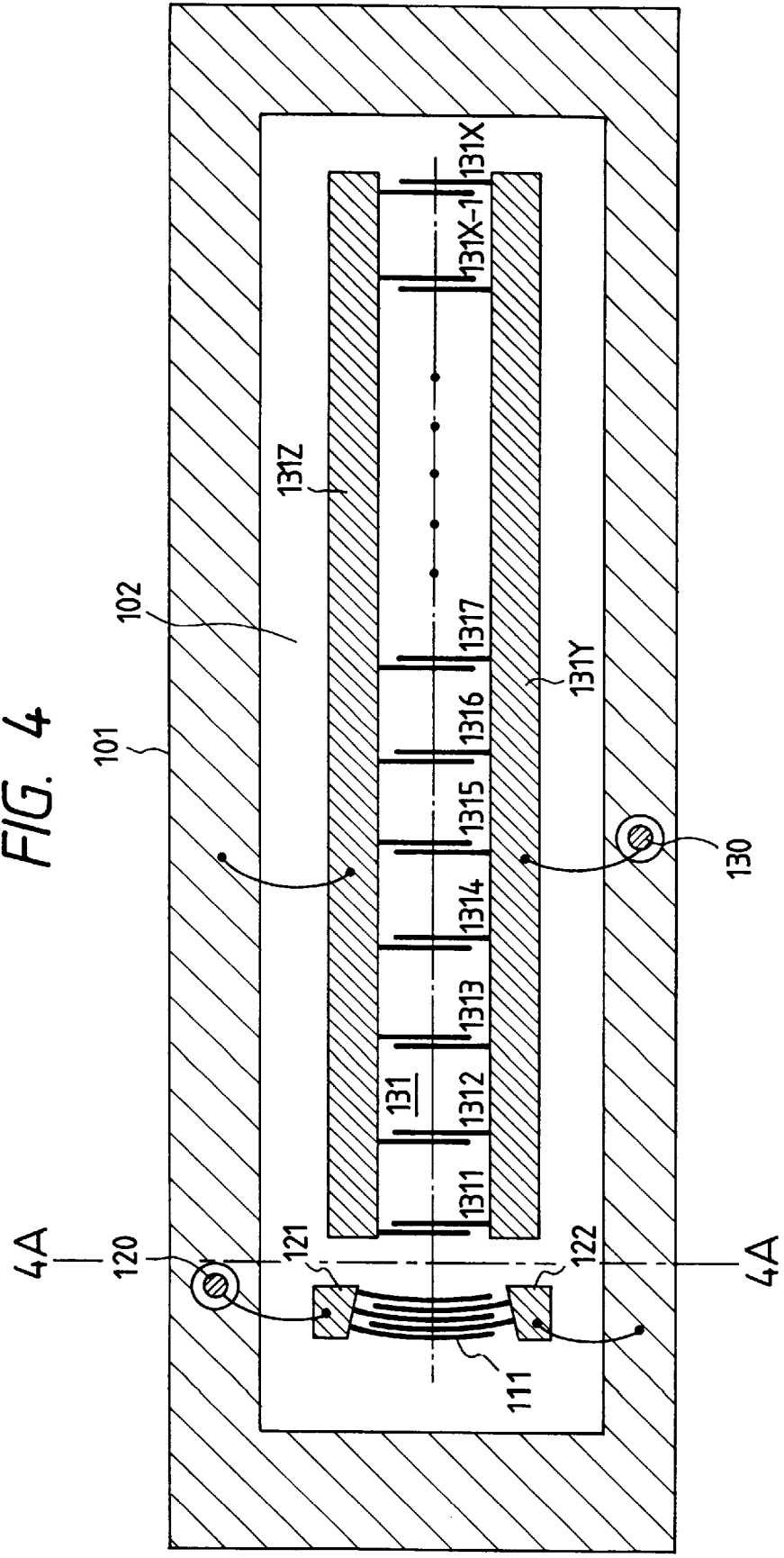

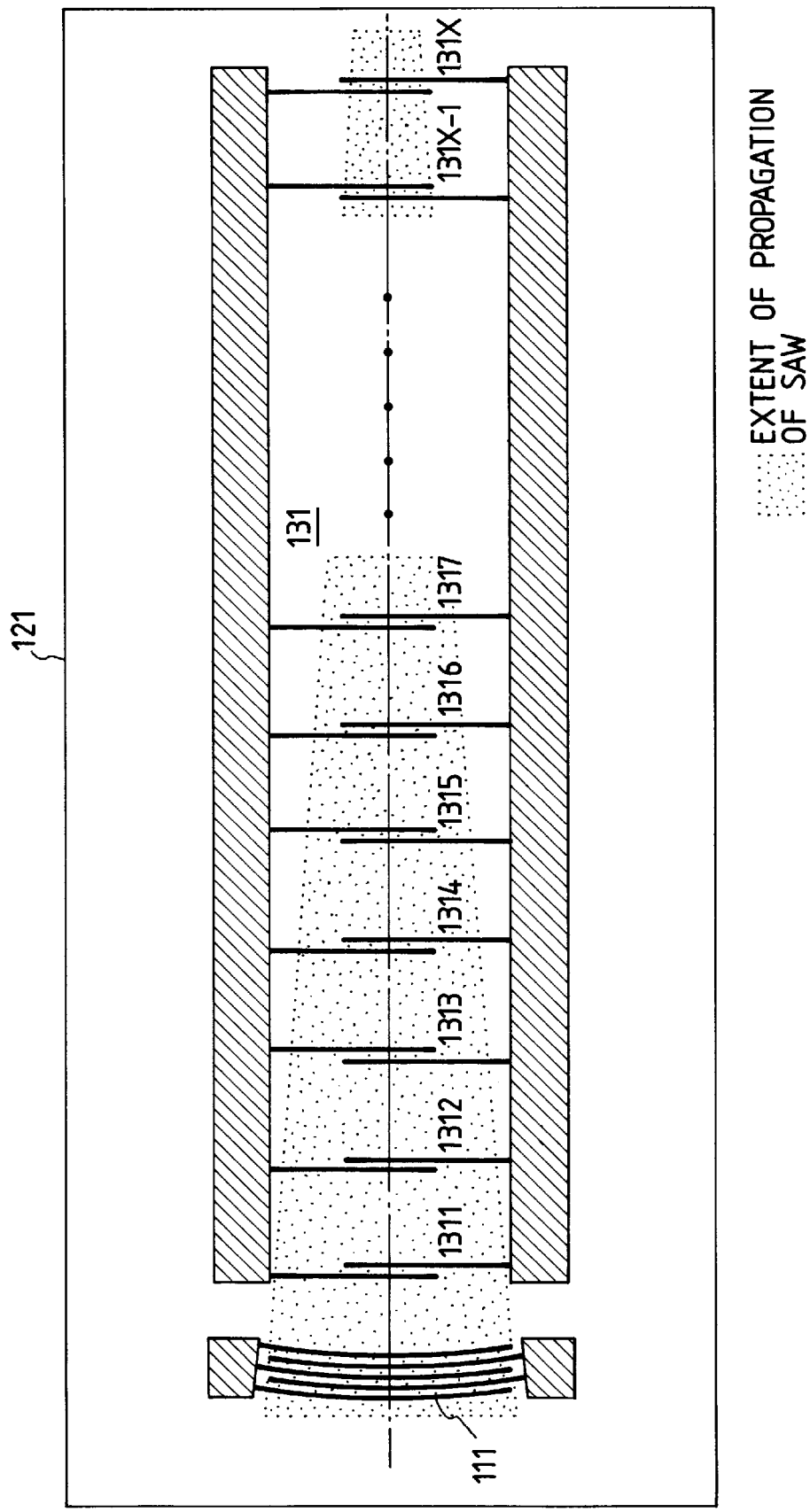

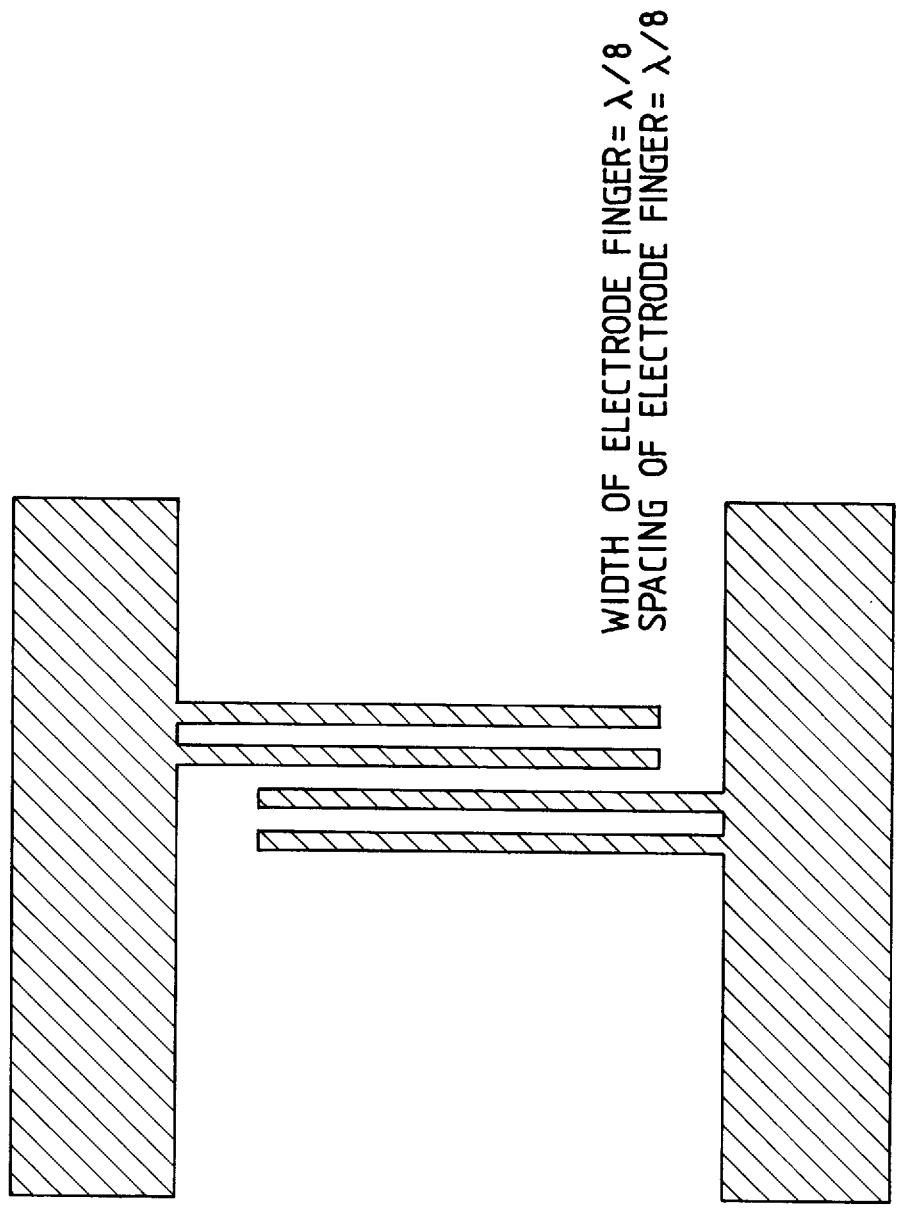

MATCHED FILTER WITH IMPROVED SYNCHRONOUS CHARACTERISTICS, AND RECEPTION DEVICE AND COMMUNICATION SYSTEM USING THE SAME

BACKGROUND OF THE INVENTION

1. Field of the Invention

The present invention relates to a matched filter used in decoding and synchronous detection of signals spread by a pseudo noise signal. The present invention also relates to a receiver using the filter and a communication system using the receiver.

2. Related Background Art

In recent years, electromechanical functional elements using surface acoustic waves (SAWs) have been actively adopted in various fields. This is due to the following facts. That is, size reductions of equipment can be realized since the sound velocity of acoustic waves excited on the surface of a substance is as high as several km/s. In addition, it is expected that it may be possible to generate, detect, and control acoustic waves on a solid state surface since the energy of SAWs is concentrated near the surface portion of a transmission medium.

An example of SAWs as applied to signal processing is a spread spectrum (SS) communication method. In this method, a signal to be transmitted is spread and converted using a code signal sequence having a frequency band considerably broader than the original frequency band of the signal. The converted signal is then transmitted. Thereafter, the signal is detected by a reception device that responds to only the code signal sequence. The reception device compresses and despreads the signal to reproduce an original signal. In this case, a matched filter of a SAW device is used as a device that responds to only the code signal sequence. The matched filter detects a correlation value by integrating signals spread by a pseudo noise (PN) sequence of a direct spread (DS) method for one period of the PN sequence upon establishing synchronization at the receiving side. The matched filter device used for establishing synchronization has a structure in which electrodes are attached with predetermined spacings in the middle of the propagation path of sound waves, and serve as intermediate taps that can output a large number of signals having intermediate delay amounts. The spacing between adjacent taps is set so that the delay amount exactly corresponds to the chip width of the PN sequence. In this manner, a SAW device with taps of a PN sequence corresponding to spread signals of a predetermined PN sequence can easily detect a correlation value.

In recent years, a matched filter, especially a matched filter using SAWs, has gained its importance as a device for establishing synchronization upon execution of SS (spread spectrum) communications.

FIG. 1 is a schematic view showing a conventional SAW device. Referring to FIG. 1, a piezoelectric substrate 121 comprises, e.g., an ST-cut quartz substrate, and an input IDT (InterDigital Transducer) 111 that converts an electrical signal into SAW signals. An output IDT has electrode finger pairs 1311, 1312, 1313, . . . The electrode directions of these electrode finger pairs 1311, 1312, 1313, . . . , i.e., which of the electrode fingers connected to either the upper or lower electrodes in FIG. 1 are to be disposed at the input IDT side, are determined in correspondence with the PN sequence of a signal input to the input IDT. When an input PN code sequence signal matches the code sequence of the output electrode fingers, a maximum correlation value is obtained. This performance defines the characteristics required for the matched filter. The spacing between adjacent electrode finger pairs corresponds to the distance the SAW signals generated by the input IDT 111 propagate within a time corresponding to the 1-chip length of the PN code sequence.

These electrodes consist of a conductive material such as aluminum and are normally formed by coating a piezoelectric substrate with a material such as aluminum by deposition or sputtering and patterning the coating using a photolithography technique.

In the SAW device with the above-mentioned arrangement, when an electrical signal having a carrier angular frequency ω multiplied with a PN spread code is input to the input IDT 111, the electrical signal is converted to excite SAW signals owing to the piezoelectric effect of the substrate. For example, when the PN spread code is a binary signal of zeros and ones SAW signals, the phase of which is inverted every time the code value changes, are output from the input IDT 111, and travel along the right and left sides of the electrode. In the output IDT 131, the electrode directions of the electrode finger pairs 1311, 1312, 1313, . . . , 131x constituting the IDT are determined in correspondence with the PN spread code (for example, the directions of the electrode finger pairs 1313 and 1315 are reversed from those of other electrode finger pairs). The spacing between adjacent electrode finger pairs corresponds to the distance SAW signals generated by the input IDT 111 travel within a time corresponding to the 1-chip length of the PN code sequence. For this reason, the SAW signals output from the input IDT 111 propagate for a time period corresponding to the total code length, and a large output electrical signal is obtained only when the phases of the SAW signals are locked with those of the output electrode finger pairs 1311, 1312, 1313, . . . , 131x. Since this signal is output every time one PN code sequence has propagated the output IDT 131, a synchronous signal matching that of an input code can be obtained. The mechanism of the SAW matched filter is described in detail in Mikio Shibayama, ed., "Technology of Surface Acoustic Wave", The Institute of Electronics, Information and Communication Engineers, pp. 200–205 or the like.

However, in such matched filter, the relative intensities of excited waves of SAW signals output from the input IDT 111 have a distribution in which the intensity at the outermost sides of the crossing portion of the electrode fingers of the input IDT 111 is larger than that at the central portion. FIG. 2 shows the SAW intensity excited in the input IDT of the SAW matched filter (SAW intensity at a position about 2λ from the IDT when the crossing width of the IDT is 20λ). For this reason, divergence of SAW signals has a large influence, and as the output electrode finger pair is separated farther away from the input IDT, the amount converted into an electrical signal becomes smaller.

FIG. 3 shows the result of simulation using the Huygens' principle for the SAW intensity distribution obtained when SAW signals propagate as described above. In FIG. 3, the lighter the color becomes, the stronger the SAW intensity becomes. In this case, codes at the beginning of a code sequence that propagate earlier are converted into electrical signals in smaller amounts, and codes closer to the end of the code sequence in the obtained output signal become signals subjected to a kind of weighting. Therefore, a synchronous signal obtained as a result of correlation between the electrode directions of the output electrode finger pairs 1311, 1312, 1313, . . . , 131x and the SAW signals becomes smaller than the designed value, and the S/N ratio decreases, thus causing a drift in the synchronous timing.

Furthermore, in the above-mentioned matched filter, since SAW signals propagating from the input IDT 111 are partially converted into electrical signals every time they pass through the electrode finger pairs 1311, 1312, 1313, . . . , 131x of the output IDT, the signals gradually become smaller. As a result, the weighting is further emphasized.

SUMMARY OF THE INVENTION

The present invention solves the above-mentioned problems, and a matched filter according to the present invention has a first anti-divergence means for shaping the equiphase surface of propagating SAWs into a concave surface. With this means, the influence of divergence on the propagation of SAWs can be eliminated.

Especially, in the present invention, the first anti-divergence means may adopt an arrangement in which an input IDT of the matched filter is arranged in a concave pattern toward an output IDT, so that the input IDT also serves as the first anti-divergence means, or the first anti-divergence means may adopt an arrangement in which an acoustic lens is inserted between the input IDT and the output IDT. In the arrangement in which the concave-shaped input IDT is used, the input IDT may have a substantially arcuated shape. In particular, the shape may slightly deviate from an arcuated shape so as to reduce divergence, in the propagation direction, of the convergence position of SAWs which are excited and propagated.

Furthermore, the input IDT to be used may be designed so that the intensity of a SAW excited at the central portion, in the crossing width direction, of the crossing portion of electrode fingers is stronger than that of SAWs excited at the outer sides of the crossing portion. This structure is particularly preferable for the following reason. Since the equiphase surface of propagating SAWs has a concave shape, SAWs excited at the outer sides of those excited by the input IDT can be prevented from diverging, and the intensity of a SAW excited at the central portion having a relatively small influence of divergence can be further enhanced.

On the other hand, the equiphase surface of propagating SAWs is not limited to the concave shape that can prevent divergence of waves, but may converge as SAWs propagate. When the equiphase surface converges as SAWs propagate, the width of SAWs to be input to the output IDT is set to be larger than at least the crossing width of the electrode fingers of the input IDT side, so that SAWs which propagate along the non-crossing portions of electrode fingers on the input IDT of those of the output IDT are present. With this arrangement, since SAWs which have not passed through the crossing portions of the electrode fingers, on the side closer to the input IDT, of the output IDT can reach the crossing portions, on the side farther from the input IDT, of the output IDT, the influence of the crossing portions of the electrode fingers on the side closer to the input IDT on SAWs input to the crossing portions of the electrode fingers on the side farther away from the input IDT can be reduced. As the arrangement in which the width of SAWs to be input to the output IDT is set to be larger than at least the crossing width of the electrode fingers on the input IDT side, for example, the crossing width of the electrode fingers of the input IDT can be set to be larger than the crossing widths of at least the electrode fingers, nearest to the input IDT, of those of the output IDT.

When SAWs converge as they propagate, the convergence position is preferably set near the electrode fingers, farthest from the input IDT, of those of the output IDT.

On the other hand, the electrode fingers of one or both of the input IDT and the output IDT may comprise split electrodes, and one or both of the input IDT and the output IDT may comprise a unidirectional IDT.

Although a substrate having piezoelectric characteristics is used in the matched filter of the present invention, a substrate such as an ST-cut quartz substrate in which a change in velocity of SAWs due to a change in temperature is substantially zero is preferably used. As with the substrate having piezoelectric characteristics, a substrate on the surface of which a thin film is formed and in which a change in velocity of SAWs due to a change in temperature is substantially zero may be used.

Also, the present invention provides a receiver which uses the matched filter that can obtain a high-precision correlation signal in decoding or synchronous detection of spread spectrum signals, and a communication system using the receiver.

BRIEF DESCRIPTION OF THE DRAWINGS

FIG. 4 is a schematic view showing a SAW matched filter according to the first embodiment of the present invention;

FIG. 6 is a schematic view showing a SAW matched filter according to the second embodiment of the present invention;

FIGS. 7A and 7B are schematic views showing the arrangement when the SAW matched filter of the present invention adopts split electrodes;

Figure 1:
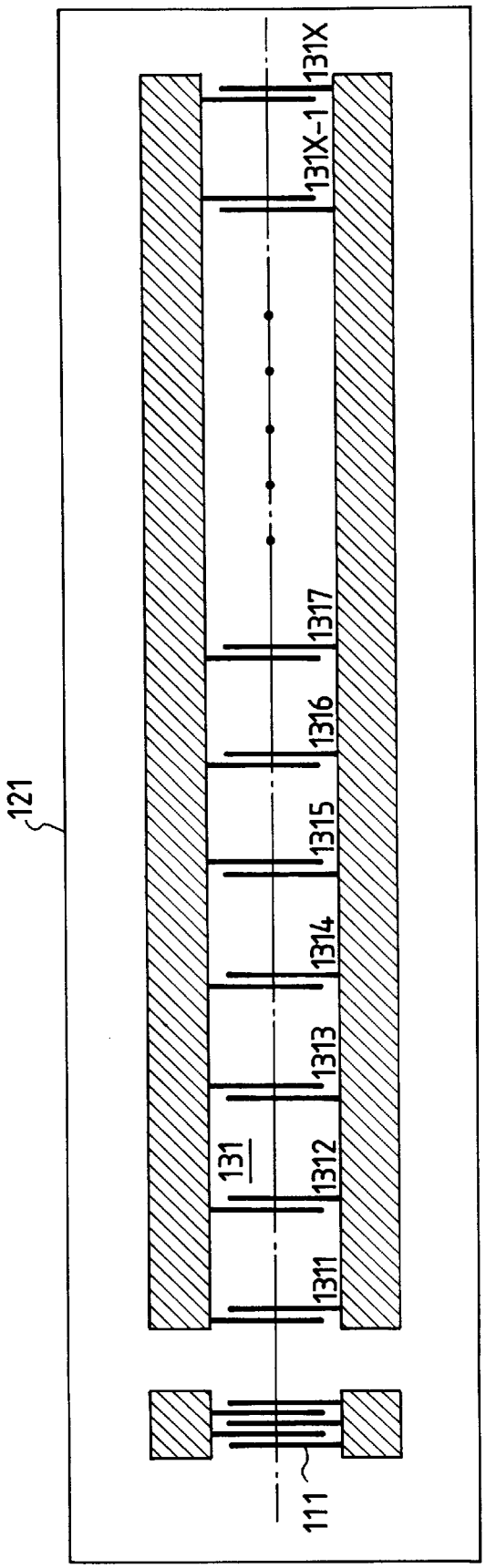
FIG. 1 is a schematic view showing the arrangement of a conventional SAW matched filter.
Figure 2:
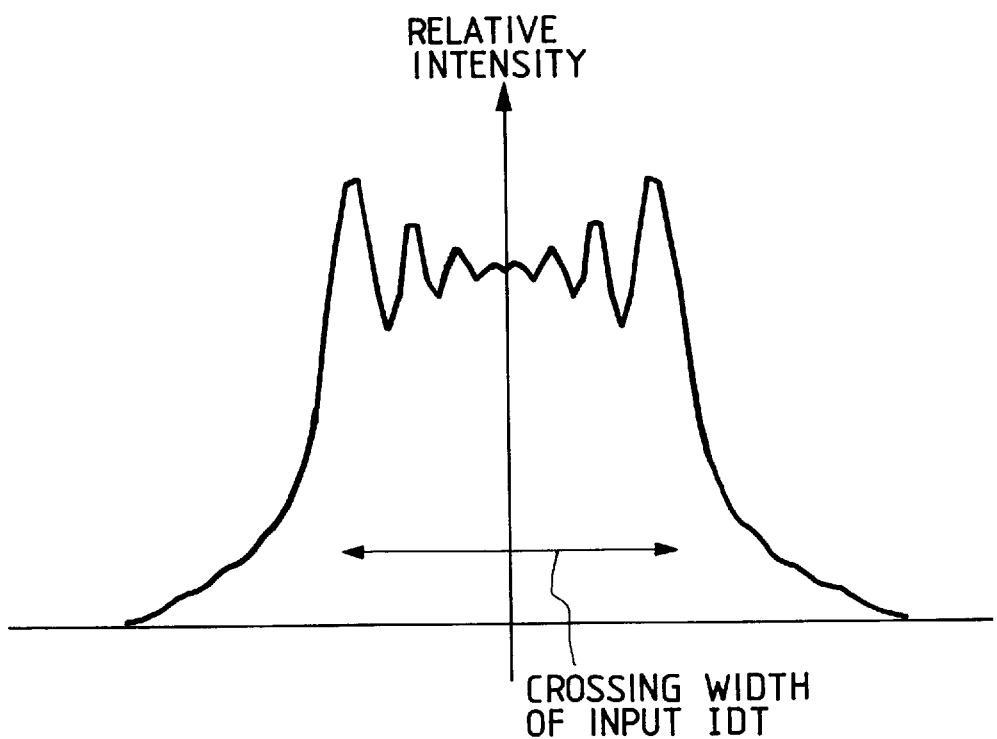
FIG. 2 is a graph showing the intensity distribution of SAWs excited by an input IDT of the conventional matched filter.

DETAILED DESCRIPTION OF THE PREFERRED EMBODIMENTS (First Embodiment)

FIG. 4 is a schematic view of a surface acoustic wave (SAW) matched filter according to the present invention. Referring to FIG. 4, a stem 101 fixes a matched filter chip. A piezoelectric substrate 102 comprises, e.g., an ST-cut quartz substrate. An input IDT 111 converts an electrical signal into SAW signals. A bus bar 121 supplies an IF signal matching the input center frequency of the matched filter from a spread spectrum input signal via an input pin 120. Bus bars 122 and 131Z connect a ground electrode serving as the reference potential. Bus bar 131Y extracts the output of the SAW matched filter and supplies an output to SAW matched filter output pin 130. An output IDT 131 has electrode finger pairs 1311, 1312, 1313, . . . , 131X. The electrode directions of these electrode finger pairs 1311, 1312, 1313, . . . , 131X, i.e., which of the electrode fingers connected to either the upper or lower electrodes in FIG. 4 are to be disposed at the input IDT side, are determined in correspondence with a PN code of a signal input to the input IDT. For example, when the input code sequence is 1101011 . . . 01, the direction of the electrode finger pairs 1313, 1315, and 131X-1 is opposite that of other electrode finger pairs.

The spacing between adjacent electrode finger pairs corresponds to the distance SAW signals generated by the input IDT 111 propagate within a time corresponding to the 1-chip length of the code sequence. The input IDT 111 has an arcuated shape with the concave surface facing the output IDT 131. The arcuated shape of the concave surface is not a shape that allows SAWs to converge, but does prevent SAWs excited by the input IDT from diverging and allows SAWs to propagate substantially straight toward the output IDT.

Figure 4A:
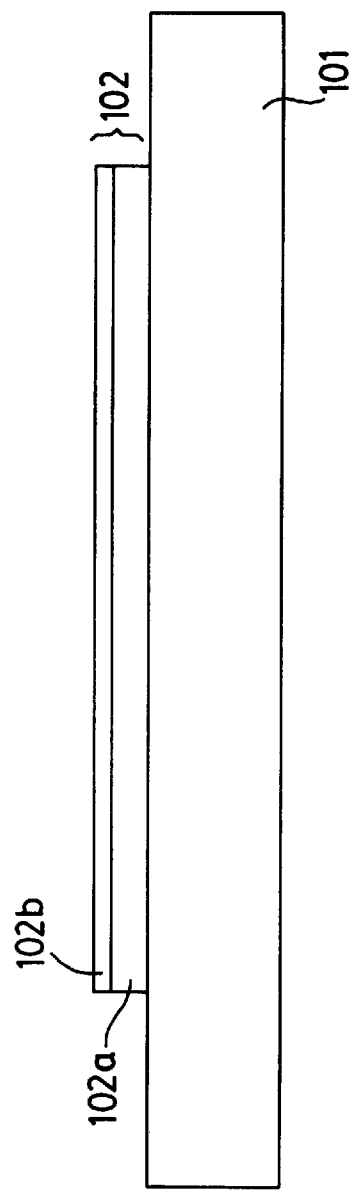
FIG. 4A is a view showing a cross-section of a saw matched filter according to the first embodiment.

FIG. 4A shows a cross-sectional view of the SAW matched filter device depicted in FIG. 4. The cross-section of the SAW matched filter as discussed in this embodiment shows a substrate 102a and a thin film 102b provided on the substrate.

Figure 5:
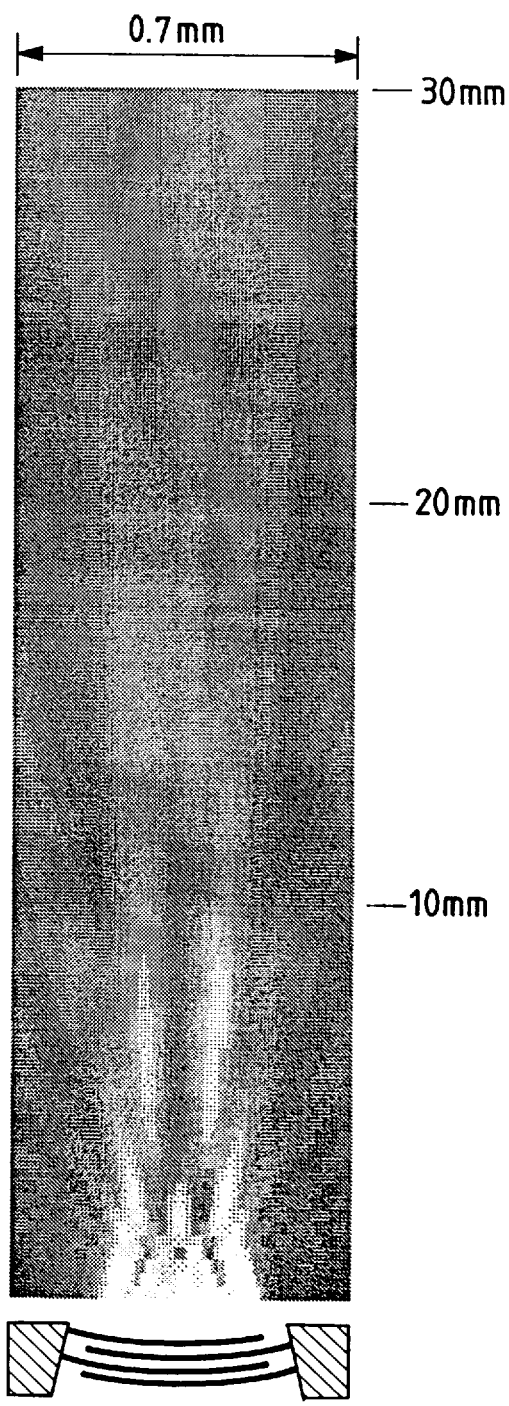
FIG. 5 is a view showing the simulation result of the intensity distribution of SAWs excited by an input IDT of the SAW matched filter according to the first embodiment.

FIG. 5 shows the result of simulation using the Huygens' principle for the intensity distribution of SAWs obtained when SAWs excited by the arcuated IDT propagate along a Y-cut lithium niobate substrate as one example of the piezoelectric substrate in the Z-axis direction. The SAW matched filter normally adopts an ST-cut quartz substrate which suffers fewer changes in velocity upon changes in temperature. However, FIG. 5 shows the SAW intensity distribution in the case of a Y-cut lithium niobate substrate as an example of the propagation state of SAWs. In this example, the input signal to the arcuated IDT has a center frequency of 200 MHz, a radius of curvature of 20 mm, and a central angle of the arc of 20°.

Figure 3:
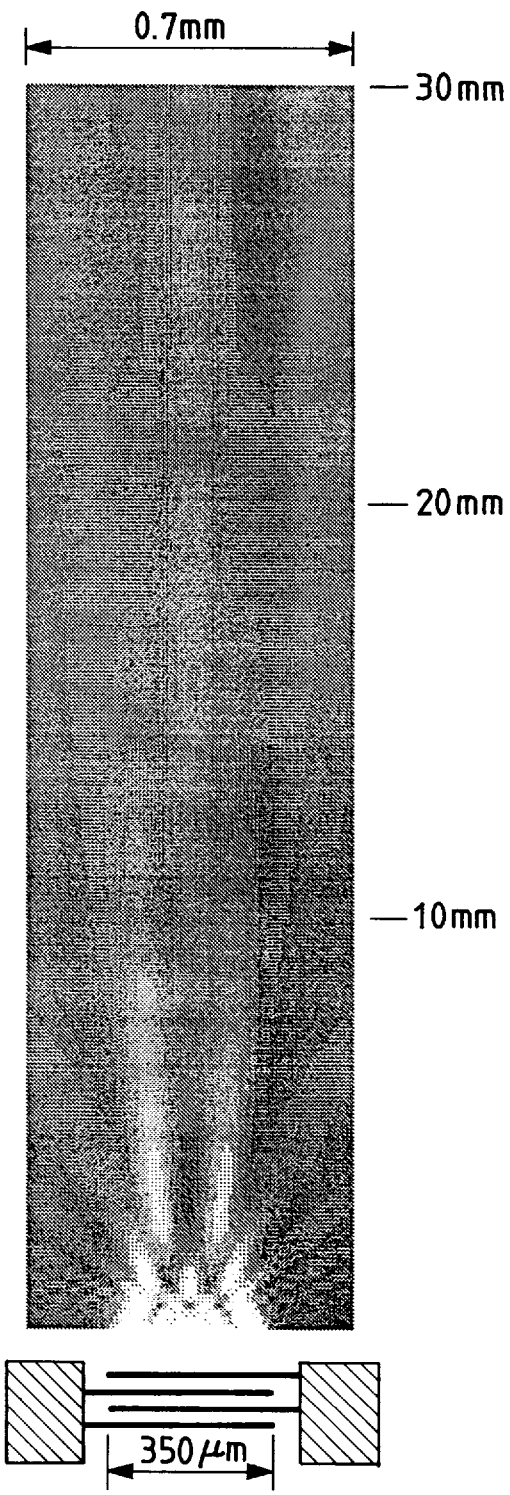
FIG. 3 is a view showing the two-dimensional intensity distribution of SAWs excited by the input IDT of the conventional matched filter.

As can be seen from FIG. 5, the SAW intensity near the center is higher than that in FIG. 3, and SAWs concentrated on the central line of the arcuated IDT propagate 20 mm or more from the proximity of the end face of the output electrodes.

The piezoelectric substrate may adopt a form in which the change in velocity due to a change in temperature is substantially zero or which is designed to have a change in velocity of substantially zero due to a change in temperature by forming a thin film on the piezoelectric substrate. In this case, a change in correlation peak detection level and a time shift of a synchronous signal due to a change in ambient temperature can be suppressed when the device is used in, e.g., an SS communication system.

With the above-mentioned shape of the input IDT, since the influence of divergence of SAWs can be eliminated, when a substrate such as an ST-cut quartz substrate, which has a small electromechanical coupling coefficient and suffers only a slight loss due to the electrode finger pairs, on the input IDT side, of the output IDT, is used, the detected signal level SAW/electric-converted by the output electrode finger pairs on the input IDT side of the output IDT can be substantially equal to that obtained by the output electrode finger pairs farther from the input IDT of the output IDT, and a correlation peak matching the input code sequence can be obtained at high level. In order to permit further uniformity between the detected levels of the respective electrode finger pairs of the output IDT, a method of apodizing the electrode fingers by weighting the crossing width of the electrode finger pairs of the output IDT may be used.

(Second Embodiment)

FIG. 6 is a schematic view showing another embodiment of a surface acoustic wave (SAW) matched filter according to the present invention. The same reference numerals in FIG. 6 denote the same parts as in FIG. 4. Referring to FIG. 6, the input IDT 111 has an arcuated shape with the concave surface facing the output IDT 131 or a pseudo arcuated shape in consideration of the angle dependence of the propagation velocity of ultrasonic waves that propagate on the piezoelectric substrate. A position where SAWs excited by the input IDT 111 with this shape are concentrated, form a straight equiphase surface perpendicular to the propagation direction, and are in phase with each other, i.e., the focal point of the IDT 111 is set near the electrode finger pair 131X, farthest from the input IDT 111, of the output IDT 131. In this case, since some of SAW signals propagating from the input IDT 111 travel without passing through the crossing electrode portions of the electrode finger pairs 1311, 1312, . . . of the output IDT, the amount of energy to be converted into an electrical signal by the electrode finger pairs 1311, 1312, . . . of the output IDT decreases as compared to the conventional matched filter shown in FIG. 1, and conversely, the amount of energy to be converted into an electrical signal near the electrode finger pair 131X of the output IDT farthest from the input IDT 111 increases. In this manner, the SAW energy amount that decreases as SAWs propagate along the electrode finger pairs of the output IDT can be compensated for by the energy amount obtained by SAWs concentrated at the focal point, and the electrode finger pair 131X of the output IDT farthest from the input IDT 111 can convert an electrical signal in an amount substantially equal to that of an electrical signal converted by the electrode finger pair near the input IDT.

In this manner, the respective electrode finger pairs of the output IDT can output electrical signals having substantially constant converted signal levels, and a more accurate correlation peak can be obtained with respect to an input signal of a predetermined code sequence. Therefore, a high-level synchronous signal matching the input code sequence can be obtained.

(Third Embodiment)

Figure 7A:
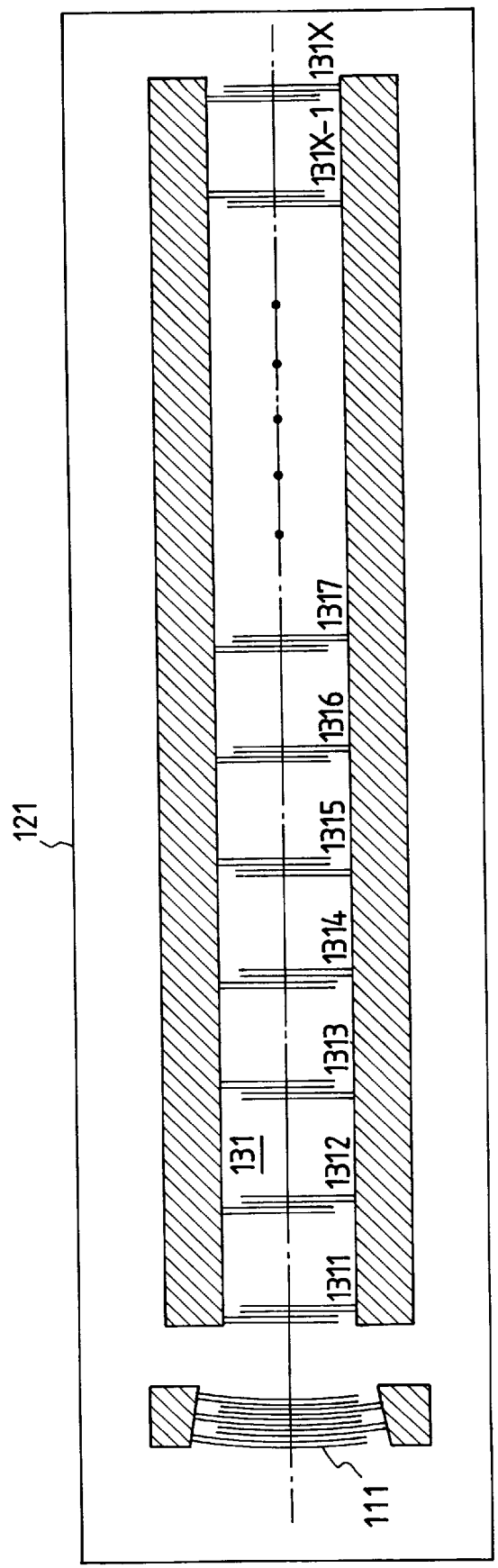

FIGS. 7A and 7B are schematic views showing the arrangement used when the electrode fingers of the input IDT and the output IDT in the surface acoustic wave (SAW) matched filter of the first or second embodiment of the present invention comprise split electrodes. In the case of the matched filter, since the time required for a SAW that has passed through a given electrode pair of the output IDT to reache the next electrode finger pair equals the time required for a SAW reflected by a given electrode finger pair to reache the immediately preceding electrode finger pair, the influence of reflected waves serving as a noise source must be eliminated. FIG. 7B is an enlarged view of the electrode finger pairs of the output IDT shown in FIG. 7A. In FIGS. 7A and 7B, the line width and spacing of the electrode fingers are respectively $\lambda/8$. The split electrodes shown in FIGS. 7A and 7B are used as means for suppressing reflected waves in a SAW device, but are also effective in the matched filter of the present invention.

In this embodiment, both the input IDT and the output IDT use split electrodes. However, either the input IDT or the output IDT may use split electrodes.

(Fourth Embodiment)

Figure 8:
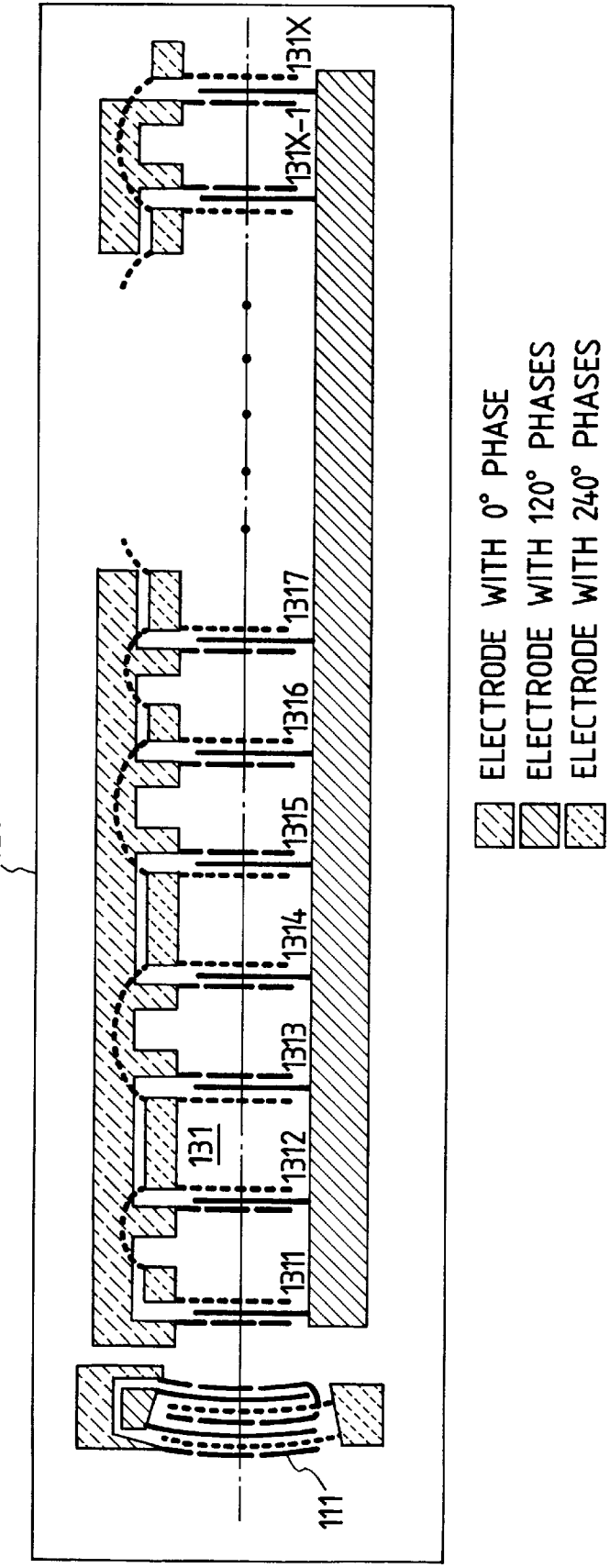
FIG. 8 is a schematic view showing the arrangement when the SAW matched filter of the present invention adopts a three-phase type unidirectional IDT.

FIG. 8 is a schematic view showing the arrangement when the input IDT and the output IDT of the surface acoustic wave (SAW) matched filter of the first or second embodiment of the present invention comprise three-phase type unidirectional IDTs. A three-phase type unidirectional IDT obtains unidirectional characteristics by exciting or receiving SAWs using electric fields having phases 120° apart from each other (or electric fields with 0° and 60° phases). For example, signals output from the electrode finger pairs 1313, 1315, and 131X-1 of the output IDT have signs opposite to those of other electrode finger pairs, and signals synchronous with the input code sequence are obtained.

Figure 9:
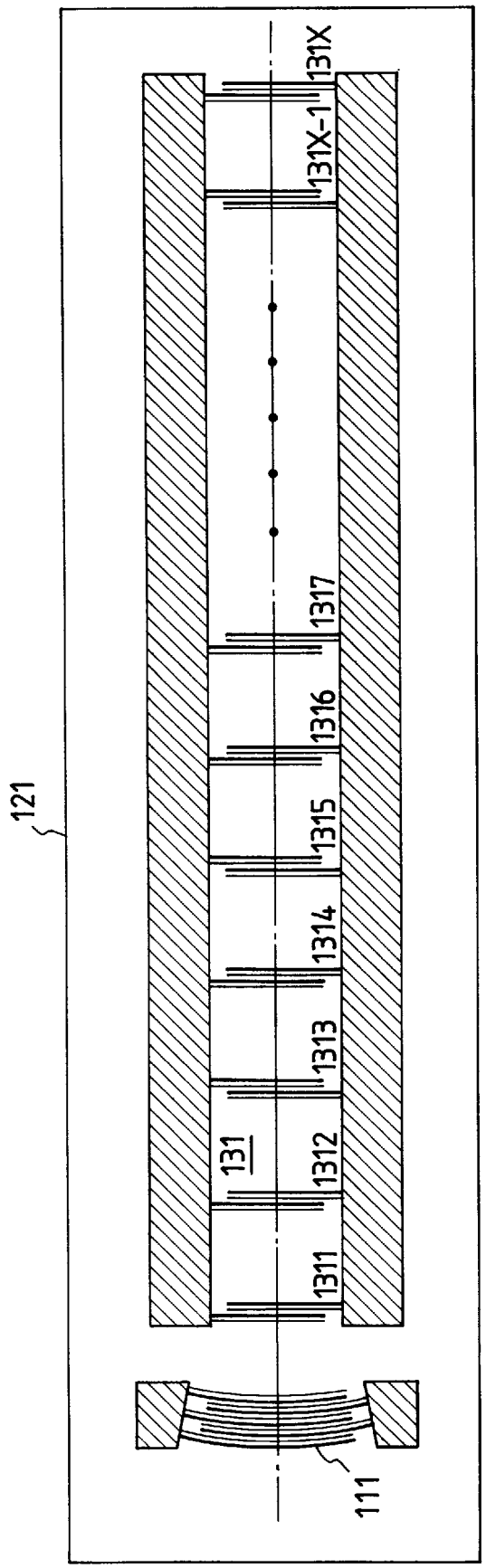
FIG. 9 is a schematic view showing the arrangement when the SAW matched filter of the present invention adopts split electrodes that obtain unidirectionality by offsetting the reflection center from the excitation center.

Ideally, the three-phase unidirectional IDT suffers almost no reflection at the electrode fingers and is expected to have an increase in output by 6 dB as compared with a bidirectional IDT. On the other hand, as shown in FIG. 9 an IDT, which obtains unidirectional characteristics by shifting the reflection center from the excitation center such that one electrode finger of the split electrode shown in FIGS. 7A and 7B is formed to be thick and the other electrode finger is formed to be thin, as shown in FIG. 9, can be manufactured by a single photolithography process although it has small unidirectional characteristics. For this reason, a high-efficiency matched filter can be obtained with low cost, and a higher-level correlation peak can be obtained by suppressing reflection components due to the IDT of a synchronous signal synchronized with the input code sequence.

Various other means for obtaining unidirectional characteristics such as a group type unidirectional SAW device, a reflection bank type device, a unidirectional SAW device using reflection by floating electrodes, and the like have been proposed (150th Acoustic Wave Technique Committee of the Japan Society For Promotion of Science, ed., "Acoustic Wave Element Technique Handbook", OHM-sha Shuppan, pp. 193–195). These unidirectional SAW devices may be applied to the present invention.

Figure 10:
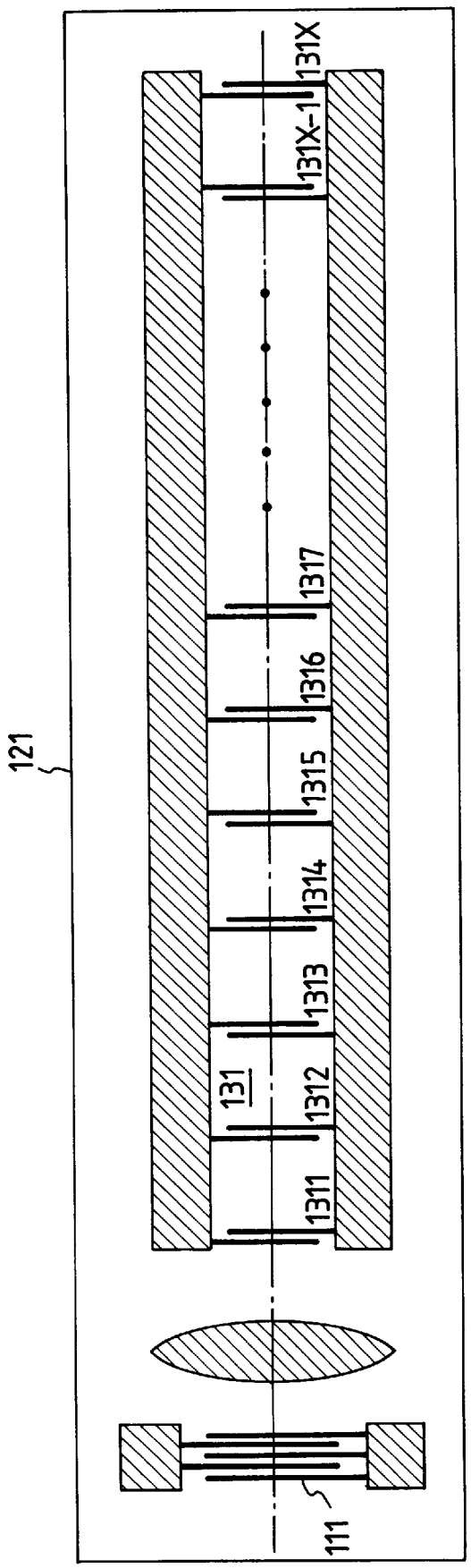
FIG. 10 is a schematic view showing the arrangement in which the equiphase surface of SAWs is shaped into a concave shape using an acoustic lens.
Figure 11:
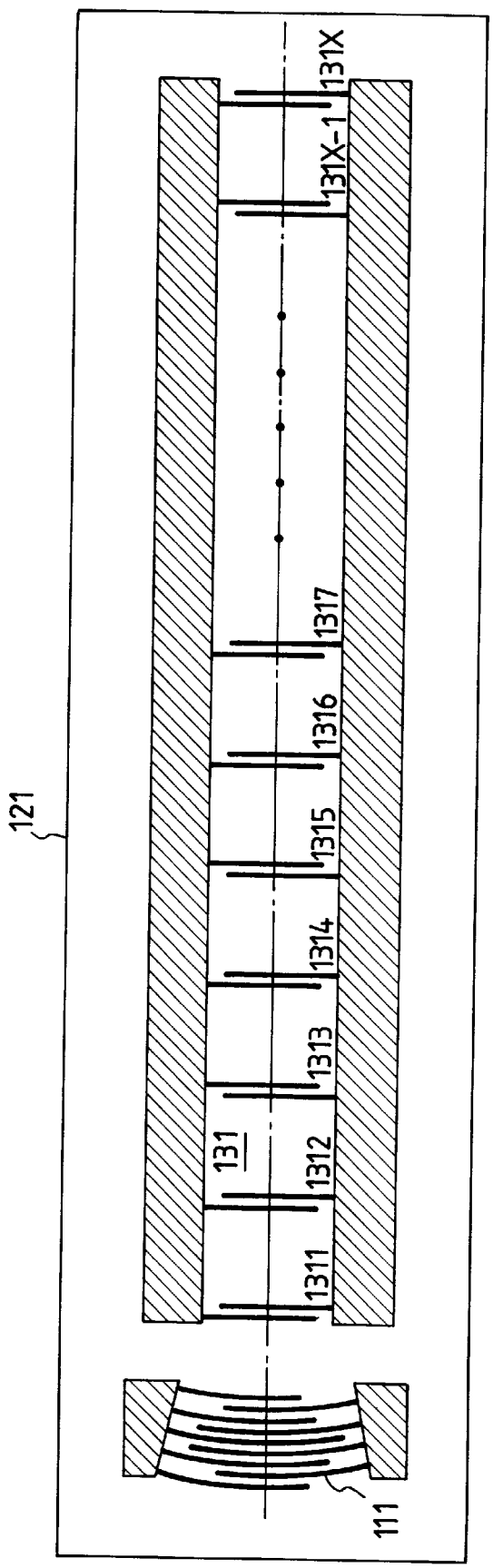
FIG. 11 is a view showing the arrangement in which apodized electrodes are used as an input IDT.

In the above-mentioned embodiments of the matched filter of the present invention, the input IDT is arranged to have a substantially arcuated shape so that the input IDT itself serves as the anti-divergence means. Alternatively, as shown in FIG. 10 as with the anti-divergence means, an acoustic lens may be used. SAWs excited by the input IDT are controlled so that their equiphase surface becomes a concave shape. FIG. 11 shows the arrangement in which an apodized IDT is used as the input IDT. With this arrangement, the electrode fingers of the input IDT to be used may be weighted so that the intensity of a SAW excited at the central portion, in the crossing width direction, of the crossing portion of electrode fingers is stronger than that of SAWs excited at the outer sides of the crossing portion. This structure is particularly preferable for the following reason. Since the equiphase surface of propagating SAWs has a concave shape, SAWs excited at the outer sides of those excited by the input IDT can be prevented from diverging, and the intensity of a SAW excited at the central portion having a relatively small influence of divergence can be further enhanced.

(Fifth Embodiment)

Figure 12:
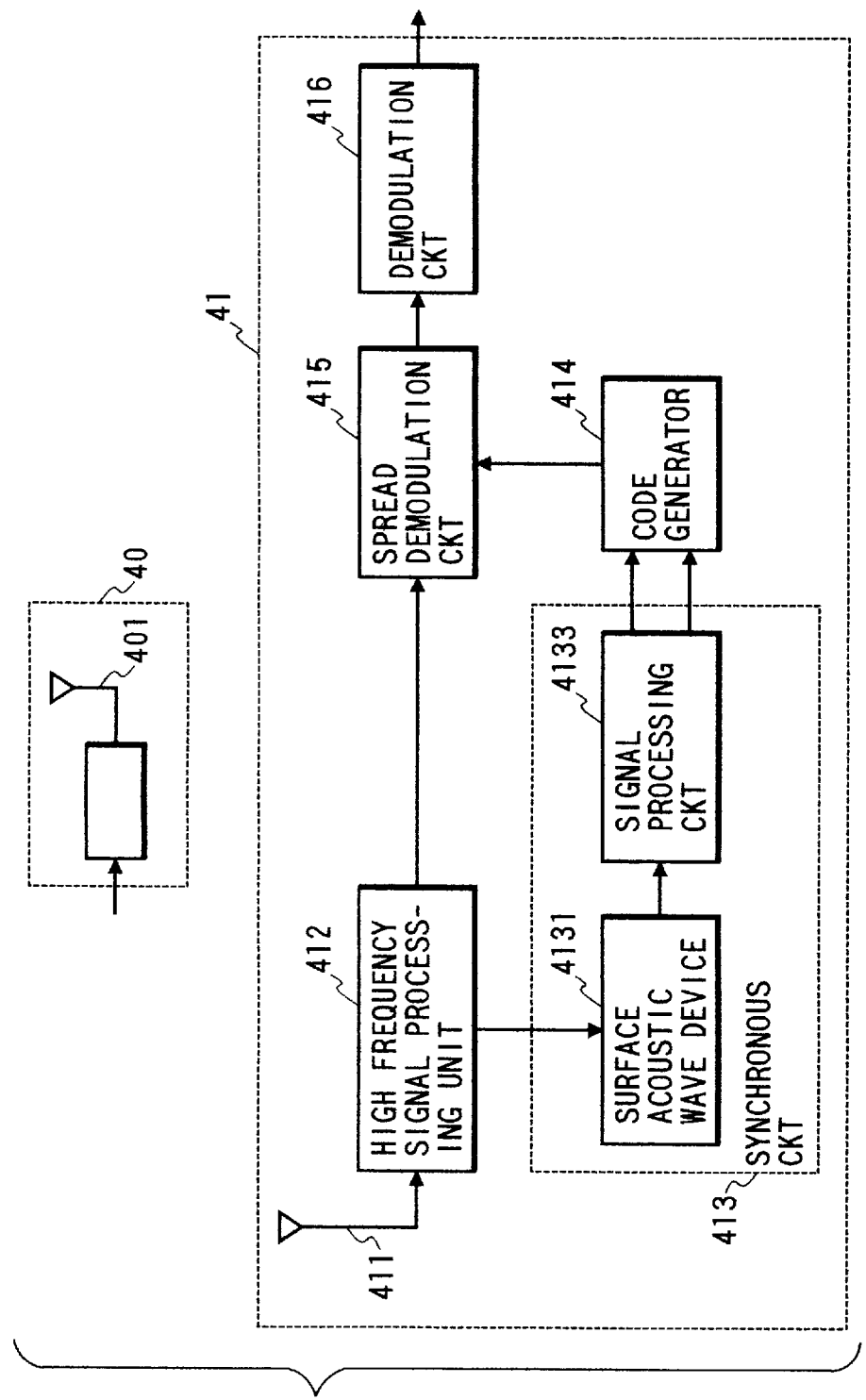
FIG. 12 is a block diagram showing an example of a communication system using a SAW device of the present invention.

FIG. 12 is a block diagram showing an example of a communication system using the above-mentioned SAW matched filter. Referring to FIG. 12, a transmission device 40 enclosed within an upper dotted rectangle SS-modulates a signal to be transmitted using a spread code, and transmits the modulated signal from an antenna 401. The transmitted signal is received by a reception device 41, and is demodulated. The reception device 41 comprises an antenna 411, a high-frequency signal processing unit 412, a synchronous circuit 413, a code generator 414, a spread demodulation circuit 415, and a demodulation circuit 416. The reception signal received by the antenna 411 is appropriately filtered and amplified by the high-frequency signal processing unit 412, and is output as a transmission frequency band signal before or after it is converted into an appropriate intermediate frequency band (IF) signal. The signal is input to the synchronous circuit 413.

The synchronous circuit 413 comprises a surface acoustic wave device 4131 using the SAW device described in each of the above embodiments, and a signal processing circuit 4133 for processing the signal output from the SAW device 4131. Synchronous circuit 413 outputs a spread code synchronous signal corresponding to the transmitted signal and a clock synchronous signal to code generator 414. The SAW device 4131, as the SAW matched filter, receives an output signal from the high-frequency signal processing unit 412, and outputs a correlation peak when the polarity of the synchronous spread code component contained in the reception signal matches that of a code sequence of the electrode finger pairs of an output IDT in the SAW matched filter 4131. Therefore, the SAW matched filter described in each of the above embodiments can obtain a synchronous signal which is free from noise interference, has a high correlation peak, and a high S/N ratio.

The signal processing circuit 4133 detects the correlation peak from the synchronous signal input from the SAW matched filter 4131, reproduces a clock signal, and outputs the spread code synchronous signal and the clock signal to the code generator 414. After synchronization is established, the code generator 414 generates a spread code whose clock and spread code phases are locked with those of the spread code at the transmitting side. This spread code is output to the spread demodulation circuit 415, which recovers the signal before spread modulation. A signal output from the spread demodulation circuit 415 is a signal modulated by a popularly used modulation method such as frequency modulation, phase modulation, or the like, and is demodulated by the demodulation circuit 416, known to those who are skilled in the art.

(Sixth Embodiment)

Figure 13:
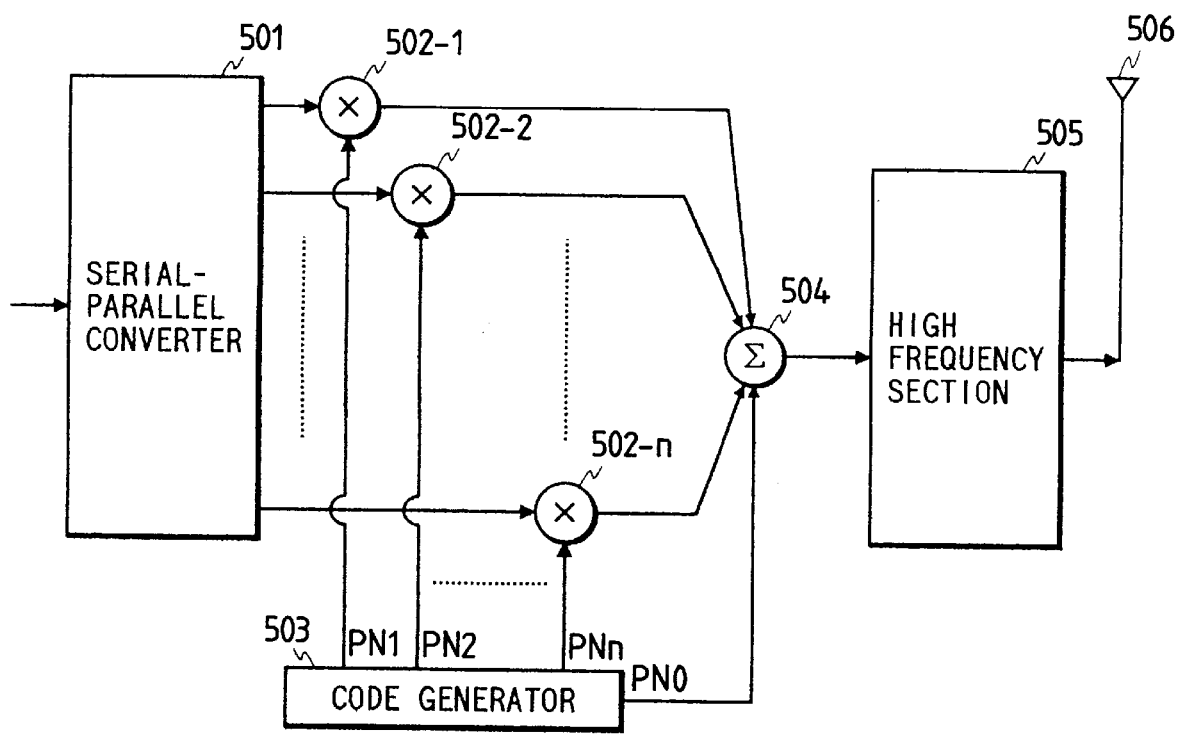
FIG. 13 is a block diagram showing an example of a transmission device of a communication system using the SAW device of the present invention.
Figure 14:
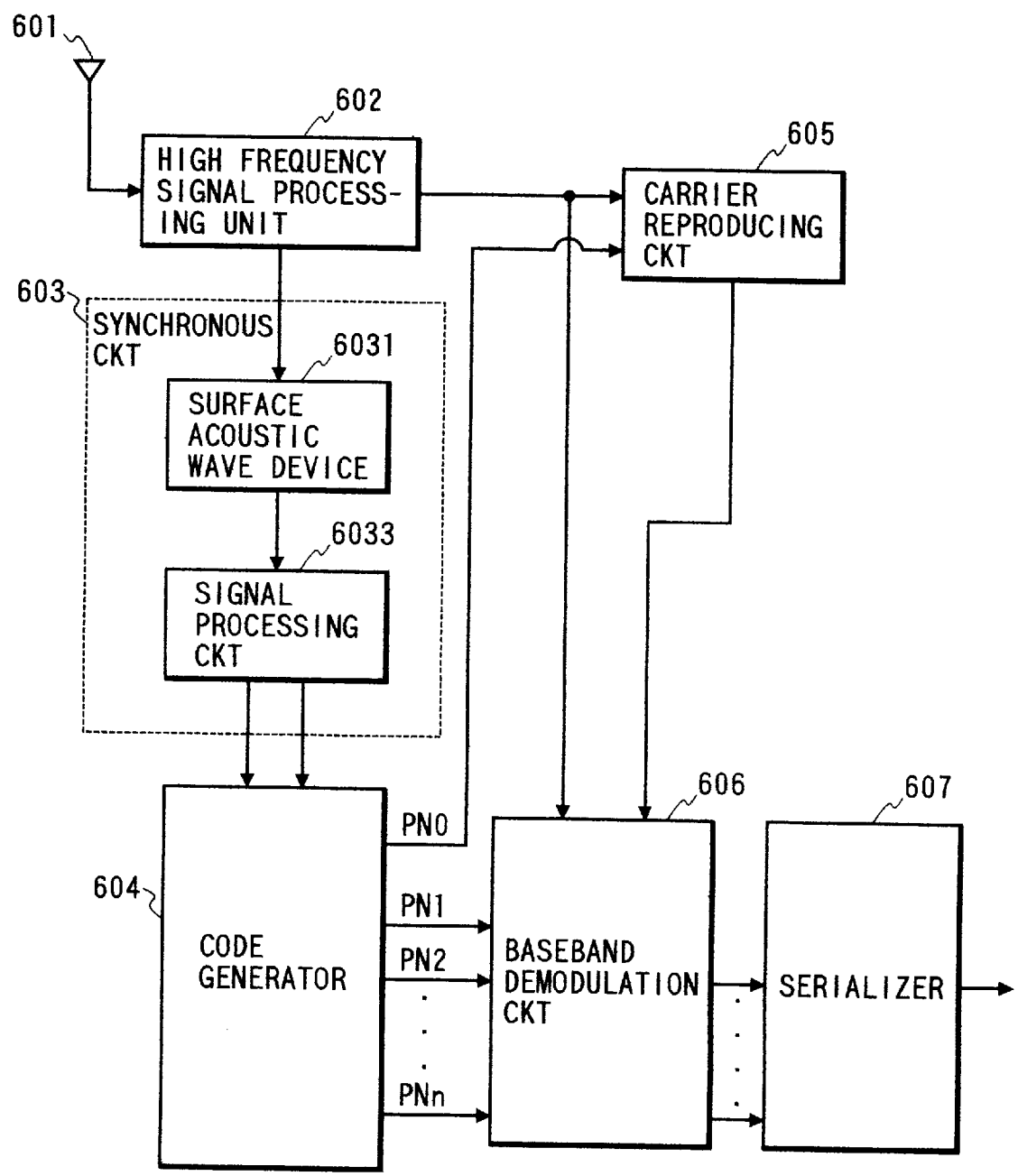
FIG. 14 is a block diagram showing an example of a reception device of a communication system using the SAW device of the present invention.

FIGS. 13 and 14 are block diagrams showing examples of the transmission and reception devices of a communication system using the SAW device described above. Referring to FIG. 13, a serial-parallel converter 501 converts input serial data into n parallel data. Multipliers 502-1 to 502-n respectively multiply n parallel data with n spread codes output from a spread code generator 503. The spread code generator 503 generate n different spread codes and a synchronous spread code. An adder 504 adds the synchronous spread code output from the spread code generator 503 to the n outputs from the multipliers 502-1 to 502-n. A high-frequency section 505 converts the output from the adder 504 into a transmission frequency signal. The converted signal is transmitted from a transmission antenna 506. Referring to FIG. 14, the transmitted signal is received by a reception antenna 601. The signal received by the antenna 601 is input to a high-frequency signal processing unit 602. A synchronous circuit 603 uses the SAW matched filter described in each of the above embodiments, which establishes and maintains synchronization with spread codes and a clock at the transmitting side. A spread code generator 604 generates n+1 spread codes PN which are identical to spread codes at the transmitting side, generates reference spread code PN0 on the basis of the code synchronous signal and receives a clock signal input from the synchronous circuit 603. A carrier reproducing circuit 605 reproduces the carrier signal on the basis of the reference (carrier reproducing) spread code PN0 output from the spread code generator 604 and the output from the high-frequency signal processing unit 602. A baseband demodulation circuit 606 performs demodulation in a baseband using the output from the carrier reproducing circuit 605, the output from the high-frequency signal processing unit 602, and n spread codes PN output from the spread code generator 604. A serializer 607 parallel-serial converts n parallel demodulated data output from the baseband demodulation circuit 605.

In the above arrangement, at the transmitting side, input data is converted by the serial-parallel converter 501 into n parallel data, the number of which is equal to the code division multiplex number. On the other hand, the spread code generator generates n+1 spread codes PN0 to PNn which have an identical code period and are different from each other. Of these codes, the spread code PN0 is exclusively used for synchronization and carrier reproduction, and is directly input to the adder 504 without being modulated by the parallel data. The n remaining spread codes PN1 to PNn are multiplied with, and modulated by, the n parallel data by the multipliers 502-1 to 502-n. The modulated codes are input to the adder 504. The adder 504 linearly adds the n+1 input signals, and outputs the sum baseband signal to the high-frequency section 505. Subsequently, the baseband signal is converted by the high-frequency section 505 into a high-frequency signal having an appropriate center frequency, and the high-frequency signal is transmitted from the transmission antenna 506.

At the reception side, the signal received by the reception antenna 601 is appropriately filtered and amplified by the high-frequency signal processing unit 602, and is output as the transmission frequency band signal before or after it is converted into an appropriate intermediate frequency band (IF) signal. The signal is input to the synchronous circuit 603. The synchronous circuit 603 comprises a surface acoustic wave device 6031 as the SAW matched filter described in each of the above embodiments of the present invention, and a signal processing circuit 6033 for processing the signal output from the SAW device 6031 and outputting a spread code synchronous signal corresponding to the transmitted signal and a clock synchronous signal to the spread code generator 604.

The SAW device 6031 receives the output signal from the high-frequency signal processing unit 602. Note that the SAW device 6031 outputs a high correlation peak when the synchronous spread code component included in the reception signal matches the polarity layout of the electrode fingers, corresponding to the signs, of the output electrode finger pairs of the SAW device 6031 on the output electrode finger pair array of the SAW device 6031 as the SAW matched filter, thus obtaining a synchronous signal with a high S/N ratio. On the other hand, when they do not match each other, the output level of the electrode finger pair array is low, and a synchronous signal cannot be obtained. The signal processing circuit 6033 detects a correlation peak from the signal input from the SAW device 6031, reproduces a clock signal of the transmitted spread code PN0, and outputs the code synchronous signal and clock signal to the spread code generator 604.

After synchronization is established, the spread code generator 604 generates spread codes whose clock and spread code phases are locked with those of the spread codes at the transmitting side. Of these codes, the synchronous spread code PN0 is input to the carrier reproducing circuit 605. The carrier reproducing circuit 605 despreads the reception signal converted into the transmission frequency band or intermediate frequency band signal as the output from the high-frequency signal processing unit 602 on the basis of the synchronous spread code PN0, thereby reproducing a transmission frequency band or intermediate frequency band carrier. The carrier reproducing circuit 605 may comprise a circuit utilizing a phase-locked loop. The reception signal and the synchronous spread code PN0 are multiplied by a multiplier. After synchronization is established, the clock and code phases of the synchronous spread code in the reception signal are locked with those of the reference synchronous spread code, and the synchronous spread code PN0 at the transmitting side is not modulated by data. For this reason, the synchronous spread code PN0 is despread by the multiplier, and its output includes a carrier component. The output from the multiplier is input to a band-pass filter, and only the carrier component is extracted and output. The output from the filter is then input to a known phase-locked loop constituting a phase detector, a loop filter, and a voltage-controlled oscillator. The voltage-controlled oscillator outputs as a reproduced carrier, a signal, the phase of which is locked with that of the carrier component output from the band-pass filter.

The reproduced carrier is input to the baseband demodulation circuit 606. The baseband demodulation circuit 606 generates a baseband signal based on the reproduced carrier output from the carrier reproducing circuit 605, and the output of the high-frequency signal processing unit 602. The baseband signal is distributed into n signals, which are despread by the spread codes PN1 to PN0 as the outputs from the spread code generator 604 in units of code division channels. The despread signals are subjected to data demodulation as parallel signals. The n parallel demodulated data are converted into serial data by the serializer 607, and the converted signal data is output.

This embodiment exemplifies binary modulation. However, the present invention may be applied to other modulation methods such as orthogonal modulation.

As described above, according to the present invention, in a so-called SAW matched filter which transmits only a signal of a code sequence matching a predetermined code sequence by exciting SAWs using an input interdigital transducer formed on a piezoelectric substrate, and receiving signals by an output interdigital transducer in which electrode fingers are arranged in correspondence with a predetermined code sequence, electrical signal converted outputs over all the output electrode finger pairs can be made consistent with respect to signals that become smaller as the code is located near the end of the code sequence due to divergence of SAWs as the SAWs propagate. Thus a signal with a high correlation peak and a high S/N ratio can be obtained.

When the SAW matched filter is used to establish synchronization of a spread spectrum (SS) communication reception device, stable demodulation with high reliability can be realized since a synchronous signal with a high S/N ratio can be obtained.

What is claimed is:

1. A surface acoustic wave matched filter comprising:
   an input interdigital transducer (IDT) formed on a substrate having piezoelectric characteristics and adapted to excite surface acoustic waves corresponding to an input code sequence signal;
   an output IDT in which electrode fingers are arranged in correspondence with a predetermined code sequence; and
   first anti-divergence means for preventing divergence of the surface acoustic waves which are excited by said input IDT and propagate toward said output IDT.

2. A filter according to claim 1, wherein said first anti-divergence means shapes an equiphase surface of the surface acoustic waves in a concave shape facing said output IDT.

3. A filter according to claim 2, wherein said input IDT has a concave shape facing said output IDT, and also serves as said first anti-divergence means.

4. A filter according to claim 3, wherein said input IDT has a substantially arcuated shape.

5. A filter according to claim 2, wherein said input IDT is weighted, so that an intensity of a surface acoustic wave excited at a central portion of the electrode fingers is higher than an intensity of surface acoustic waves at outer sides of the crossing portion.

6. A filter according to claim 2, wherein said first anti-divergence means reduces divergence upon propagation of the surface acoustic waves excited by said input IDT.

7. A filter according to claim 2, wherein a width of surface acoustic waves input to said output IDT is larger than at least a crossing width of the electrode fingers, on said input IDT side, of the electrode fingers of said output IDT, so that some of the surface acoustic waves propagate along non-crossing portions of the electrode fingers, on said input IDT side, of the electrode fingers of said output IDT.

8. A filter according to claim 7, wherein the crossing width of the electrode fingers of said input IDT is larger than the crossing width of at least the electrode fingers, nearest to the input IDT, of the electrode fingers of said output IDT.

9. A filter according to claim 2, wherein the surface acoustic waves, the equiphase surface of which is shaped into the concave shape by said first anti-divergence means, converge near the electrode finger, farthest from said input IDT, of the electrode fingers of said output IDT.

10. A filter according to claim 2, wherein said first anti-divergence means comprises an acoustic lens inserted between said input IDT and said output IDT.

11. A filter according to claim 2, wherein said substrate having the piezoelectric characteristics comprises a substrate in which a change in velocity of surface acoustic waves due to a change in temperature is substantially zero.

12. A filter according to claim 2, wherein said substrate having the piezoelectric characteristics comprises a substrate on a surface of which a thin film is formed, and in which a change in velocity of surface acoustic waves due to a change in temperature is substantially zero.

13. A filter according to claim 2, wherein said substrate having the piezoelectric characteristics comprises an ST-cut quartz substrate.

14. A filter according to claim 1, wherein said substrate having the piezoelectric characteristics comprises an ST-cut quartz substrate.

15. A filter according to claim 1, wherein said substrate having the piezoelectric characteristics comprises a substrate in which a change in velocity of surface acoustic waves due to a change in temperature is substantially zero.

16. A filter according to claim 1, wherein said substrate having the piezoelectric characteristics comprises a substrate on a surface of which a thin film is formed, and in which change in velocity of surface acoustic waves due to change in temperature is substantially zero.

17. A filter according to claim 1, wherein the electrode fingers of one or both of said input IDT and said output IDT comprise split electrodes.

18. A filter according to claim 1, wherein one or both of said input IDT and said output IDT comprise unidirectional IDTs.

19. A reception device for receiving a spread spectrum signal, comprising:
   a surface acoustic wave matched filter for performing decoding or synchronous detection of the input spread spectrum signal, said filter including:
      an input interdigital transducer (IDT) formed on a substrate having piezoelectric characteristics and adapted to excite surface acoustic waves corresponding to an input code sequence signal;
      an output IDT in which electrode fingers are arranged in correspondence with a predetermined code sequence; and
      first anti-divergence means for preventing divergence of the surface acoustic waves which are excited by said input IDT and propagate toward said output IDT.

20. A device according to claim 19, wherein said first anti-divergence means shapes an equiphase surface of the surface acoustic waves in a concave shape facing said output IDT.

21. A device according to claim 20, wherein a width of surface acoustic waves input to said output IDT is larger than at least a crossing width of the electrode fingers, on said input IDT side, of the electrode fingers of said output IDT, so that some of the surface acoustic waves propagate along non-crossing portions of the electrode fingers, on said input IDT side, of the electrode fingers of said output IDT.

22. A device according to claim 21, wherein the crossing width of the electrode fingers of said input IDT is larger than the crossing width of at least the electrode fingers, nearest to the input IDT, of the electrode fingers of said output IDT.

23. A device according to claim 20, wherein the surface acoustic waves, the equiphase surface of which is shaped into the concave shape by said first anti-divergence means, converge near the electrode finger, farthest from said input IDT, of the electrode fingers of said output IDT.

24. A device according to claim 20, wherein said input IDT has a concave shape facing said output IDT, and also serves as said first anti-divergence means.

25. A device according to claim 24, wherein said input IDT has a substantially arcuated shape.

26. A device according to claim 20, wherein said first anti-divergence means comprises an acoustic lens inserted between said input IDT and said output IDT.

27. A device according to claim 20, wherein said input IDT is weighted, so that an intensity of a surface acoustic wave excited at a central portion, in a crossing width direction, of a crossing portion of the electrode fingers is higher than an intensity of surface acoustic waves at outer sides of the crossing portion.

28. A device according to claim 20, wherein said first anti-divergence means reduces divergence upon propagation of the surface acoustic waves excited by said input IDT.

29. A device according to claim 20, wherein said substrate having the piezoelectric characteristics comprises a substrate in which a change in velocity of surface acoustic waves due to a change in temperature is substantially zero.

30. A device according to claim 20, wherein said substrate having the piezoelectric characteristics comprises a substrate on a surface of which a thin film is formed, and in which a change in velocity of surface acoustic waves due to a change in temperature is substantially zero.

31. A device according to claim 20, wherein said substrate having the piezoelectric characteristics comprises an ST-cut quartz substrate.

32. A device according to claim 19, wherein the electrode fingers of one or both of said input IDT and said output IDT comprise split electrodes.

33. A device according to claim 19, wherein one or both of said input IDT and said output IDT comprise unidirectional IDTs.

34. A device according to claim 19, wherein said substrate having the piezoelectric characteristics comprises a substrate in which a change in velocity of surface acoustic waves due to a change in temperature is substantially zero.

35. A device according to claim 19, wherein said substrate having the piezoelectric characteristics comprises a substrate on a surface of which a thin film is formed, and in which a change in velocity f surface acoustic waves due to a change in temperature is substantially zero.

36. A device according to claim 19, wherein said substrate having the piezoelectric characteristics comprises an ST-cut quartz substrate.

37. A communication system for transmitting/receiving a spread spectrum signal, comprising:

a transmitter for transmitting a spread spectrum signal; and a receiver for receiving a spread spectrum signal, said receiver including a surface acoustic wave matched filter for performing decoding or synchronous detection of the input spread spectrum signal, said filter including:

an input IDT formed on a substrate having piezoelectric characteristics and adapted to excite surface acoustic waves corresponding to an input code sequence signal;

an output IDT in which electrode fingers are arranged in correspondence with a predetermined code sequence; and first anti-divergence means for preventing divergence of the surface acoustic waves which are excited by said input IDT and propagate toward said output IDT.

38. A system according to claim 37, wherein the electrode fingers of one or both of said input IDT and said output IDT comprise split electrodes.

39. A system according to claim 37, wherein one or both of said input IDT and said output IDT comprise unidirectional IDTS.

40. A system according to claim 37, wherein said substrate having the piezoelectric characteristics comprises a substrate in which a change in velocity of surface acoustic waves due to a change in temperature is substantially zero.

41. A system according to claim 37, wherein said substrate having the piezoelectric characteristics comprises a substrate on a surface of which a thin film is formed, and in which a change in velocity of surface acoustic waves due to a change in temperature is substantially zero.

42. A system according to claim 37, wherein said substrate having the piezoelectric characteristics comprises an ST-cut quartz substrate.

43. A system according to claim 37, wherein said first anti-divergence means shapes an equiphase surface of the surface acoustic waves in a concave shape facing said output IDT.

44. A system according to claim 43, wherein said input IDT has a concave shape facing said output IDT, and also serves as said first anti-divergence means.

45. A system according to claim 44, wherein said input IDT has substantially arcuated shape.

46. A system according to claim 43, wherein said first anti-divergence means comprises an acoustic lens inserted between said input IDT and said output IDT.

47. A system according to claim 43, wherein said input IDT is weighted, so that an intensity of a surface acoustic wave excited at a central portion, in a crossing width direction, of a crossing portion of the electrode fingers is higher than an intensity of surface acoustic waves at outer sides of the crossing portion.

48. A system according to claim 43, wherein said first anti-divergence means reduces divergence upon propagation of the surface acoustic waves excited by said input IDT.

49. A system according to claim 43, wherein a width of surface acoustic waves input to said output IDT is larger than at least a crossing width of the electrode fingers, on said input IDT side, of the electrode fingers of said output IDT, so that some of the surface acoustic waves propagate along non-crossing portions of the electrode fingers, on said input IDT side, of the electrode fingers of said output IDT.

50. A system according to claim 49, wherein the crossing width of the electrode fingers of said input IDT is larger than the crossing width of at least the electrode fingers, nearest to the input IDT, of the electrode fingers of said output IDT.

51. A system according to claim 43, wherein the surface acoustic waves, the equiphase surface of which is shaped into the concave shape by said first anti-divergence means, converge near the electrode finger, farthest from said input IDT, of the electrode fingers of said output IDT.

52. A system according to claim 43, wherein said substrate having the piezoelectric characteristics comprises a substrate in which a change in velocity of surface acoustic waves due to a change in temperature is substantially zero.

53. A system according to claim 43, wherein said substrate having the piezoelectric characteristics comprises a substrate on a surface of which a thin film is formed, and in which a change in velocity of surface acoustic waves due to a change in temperature is substantially zero.

54. A system according to claim 43, wherein said substrate having the piezoelectric characteristics comprises an ST-cut quartz substrate.

* * * * *

UNITED STATES PATENT AND TRADEMARK OFFICE
CERTIFICATE OF CORRECTION

PATENT NO. :  5,815,055

DATED       :  September 29, 1998

INVENTOR(S):  TADASHI EGUCHI ET AL.

Page 1 of 2

It is certified that error appears in the above-identified patent and that said Letters Patent is hereby corrected as shown below:

COLUMN 4

Line 35, "embodiment." should read --embodiment;--;

COLUMN 6

Line 63, "reache" should read --reach--;
Line 65, "reache" should read --reach--.

COLUMN 7

Line 26, "FIG. 9 an IDT," should read --FIG. 9, an IDT--.

COLUMN 8

Line 59, "generate" should read --generates--.

COLUMN 13

Line 20, "f" should read --of--;
Line 50, "IDTS." should read --IDTs--.

UNITED STATES PATENT AND TRADEMARK OFFICE
CERTIFICATE OF CORRECTION

PATENT NO. : 5,815,055

DATED : September 29, 1998

INVENTOR(S): TADASHI EGUCHI ET AL.

It is certified that error appears in the above-identified patent and that said Letters Patent is hereby corrected as shown below:

<u>COLUMN 14</u>

Line 14, "substantially" should read --a substantially--.

Signed and Sealed this

Sixth Day of July, 1999

Q. TODD DICKINSON

Attest:

Attesting Officer

Acting Commissioner of Patents and Trademarks